(12) United States Patent
Hsu (10) Patent No.: US 9,536,864 B2
(45) Date of Patent: Jan. 3, 2017

(54) PACKAGE STRUCTURE AND ITS FABRICATION METHOD

(71) Applicant: PHOENIX PIONEER TECHNOLOGY CO., LTD., Hsinchu County (TW)

(72) Inventor: Shih-Ping Hsu, Hsinchu (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 14/445,394

(22) Filed: Jul. 29, 2014

(65) Prior Publication Data

US 2015/0279818 A1 Oct. 1, 2015

(30) Foreign Application Priority Data

Mar. 25, 2014 (TW) .............................. 103111063 A (51) Int. Cl.
*H01L 29/49* (2006.01)
*H01L 25/065* (2006.01)
(Continued)

(52) U.S. Cl.
CPC ....... *H01L 25/0657* (2013.01); *H01L 21/4853* (2013.01); *H01L 21/565* (2013.01); *H01L 21/6835* (2013.01); *H01L 21/768* (2013.01); *H01L 23/293* (2013.01); *H01L 23/3107* (2013.01); *H01L 23/528* (2013.01); *H01L 23/5384* (2013.01); *H01L 23/5389* (2013.01); *H01L 24/17* (2013.01); *H01L 24/19* (2013.01); *H01L 24/20* (2013.01); *H01L 25/50* (2013.01); *H01L 21/568* (2013.01); *H01L 23/3128* (2013.01); *H01L 23/3135* (2013.01); *H01L 23/49811* (2013.01); *H01L 24/11* (2013.01); *H01L 24/16* (2013.01); *H01L 24/81* (2013.01); *H01L 2221/68359* (2013.01);
(Continued)

(58) Field of Classification Search
CPC . H01L 25/0657; H01L 21/4858; H01L 21/768
See application file for complete search history.

(56) References Cited

U.S. PATENT DOCUMENTS 7,078,811 B2 * 7/2006 Suga ................. H01L 23/49827
257/758
7,851,345 B2 * 12/2010 Shim ................. H01L 23/49894
257/779

(Continued)

*Primary Examiner* — Michael Shingleton
(74) *Attorney, Agent, or Firm* — WPAT, PC; Justin King; Jonathan Chiang (57) ABSTRACT

This disclosure provides a package structure and its fabrication method. The package structure includes: a protective insulation layer; a wiring layer including at least one metal wire and disposed on the protective insulation layer; and a first package unit disposed on the wiring layer and including a plurality of metal pillars, a first integrated-circuit chip and a first molding compound layer; wherein the plural metal pillars are located in a pillar region and electrically connected to the at least one metal wire, the first integrated-circuit chip is located in a device region and electrically connected to the at least one metal wire, and the first molding compound layer filling up the remaining part of the first package unit.

10 Claims, 5 Drawing Sheets

(51) Int. Cl.
*H01L 21/56* (2006.01)
*H01L 21/768* (2006.01)
*H01L 23/29* (2006.01)
*H01L 23/31* (2006.01)
*H01L 23/528* (2006.01)
*H01L 23/00* (2006.01)
*H01L 25/00* (2006.01)
*H01L 21/48* (2006.01)
*H01L 23/538* (2006.01)
*H01L 21/683* (2006.01)
*H01L 23/498* (2006.01)

(52) U.S. Cl.
CPC ............ *H01L 2221/68381* (2013.01); *H01L 2224/04105* (2013.01); *H01L 2224/12105* (2013.01); *H01L 2224/13147* (2013.01); *H01L 2224/1623* (2013.01); *H01L 2224/16113* (2013.01); *H01L 2224/16227* (2013.01); *H01L 2224/16235* (2013.01); *H01L 2224/16238* (2013.01); *H01L 2224/211* (2013.01); *H01L 2224/81005* (2013.01); *H01L 2224/8146* (2013.01); *H01L 2224/81424* (2013.01); *H01L 2224/81447* (2013.01); *H01L 2224/81455* (2013.01); *H01L 2224/81904* (2013.01); *H01L 2225/06513* (2013.01); *H01L 2225/06517* (2013.01); *H01L 2225/06544* (2013.01); *H01L 2225/06586* (2013.01); *H01L 2225/06593* (2013.01); *H01L 2924/01014* (2013.01); *H01L 2924/06* (2013.01); *H01L 2924/0665* (2013.01); *H01L 2924/12042* (2013.01); *H01L 2924/15311* (2013.01); *H01L 2924/181* (2013.01); *H01L 2924/18161* (2013.01)

(56) References Cited

U.S. PATENT DOCUMENTS

| | | | | |
|---|---|---|---|---|
| 7,927,919 B1* | 4/2011 | Fan | ............... | H01L 23/3128 257/686 |
| 8,097,490 B1* | 1/2012 | Pagaila | ............... | H01L 21/561 257/E21.007 |
| 9,040,408 B1* | 5/2015 | Zhou | ............... | H01L 24/11 257/780 |
| 2004/0016939 A1* | 1/2004 | Akiba | ............... | H01L 21/565 257/126 |
| 2008/0272477 A1* | 11/2008 | Do | ............... | H01L 21/76898 257/686 |
| 2008/0296056 A1* | 12/2008 | Kinoshita | ............... | H01L 23/13 174/261 |
| 2009/0152740 A1* | 6/2009 | Park | ............... | H01L 23/552 257/778 |
| 2011/0068459 A1* | 3/2011 | Pagaila | ............... | H01L 21/56 257/698 |
| 2011/0278707 A1* | 11/2011 | Chi | ............... | H01L 21/4832 257/676 |
| 2011/0304015 A1* | 12/2011 | Kim | ............... | H01L 23/552 257/532 |
| 2012/0015481 A1* | 1/2012 | Kim | ............... | H01L 21/565 438/108 |
| 2012/0049382 A1* | 3/2012 | Malatkar | ............... | H01L 24/19 257/774 |
| 2012/0074585 A1* | 3/2012 | Koo | ............... | H01L 21/486 257/774 |
| 2012/0077312 A1* | 3/2012 | Lee | ............... | H01L 21/563 438/108 |
| 2012/0080787 A1* | 4/2012 | Shah | ............... | H01L 21/4853 257/737 |
| 2012/0104623 A1* | 5/2012 | Pagaila | ............... | H01L 23/13 257/774 |
| 2013/0037950 A1* | 2/2013 | Yu | ............... | H01L 23/49816 257/738 |
| 2013/0175702 A1* | 7/2013 | Choi | ............... | H01L 23/481 257/774 |
| 2013/0241044 A1* | 9/2013 | Kim | ............... | H01L 21/563 257/698 |
| 2014/0084478 A1* | 3/2014 | Simion | ............... | B29C 37/0075 257/774 |
| 2014/0147970 A1* | 5/2014 | Kim | ............... | H01L 25/50 438/107 |
| 2014/0264817 A1* | 9/2014 | Lee | ............... | H01L 25/50 257/712 |
| 2014/0353775 A1* | 12/2014 | Formosa | ............... | B81C 1/00238 257/415 |
| 2015/0123268 A1* | 5/2015 | Yu | ............... | H01L 24/17 257/737 |
| 2015/0235994 A1* | 8/2015 | Ohba | ............... | H01L 25/0657 257/676 |
| 2015/0279818 A1* | 10/2015 | Hsu | ............... | H01L 21/565 257/737 |
| 2015/0279819 A1* | 10/2015 | Lee | ............... | H01L 23/3157 257/737 |
| 2015/0303174 A1* | 10/2015 | Yu | ............... | H01L 25/0657 257/712 |
| 2015/0340311 A1* | 11/2015 | Usami | ............... | H01L 23/49838 257/773 |

* cited by examiner

PACKAGE STRUCTURE AND ITS FABRICATION METHOD

FIELD OF THE INVENTION

The present invention relates to a flip-chip package-on-package structure, more particularly a package structure and its fabrication method.

BACKGROUND OF THE INVENTION

As recent rapid trend in modern electronic devices is not only toward thinner, lighter and smaller devices, but also toward multifunctional and high-performance devices, the fabrication and technology of integrated circuits (ICs) has to evolve correspondingly toward a more high-density and miniature design so as to allow more electronic components to be received inside limited chip space. Consequently, the relating IC package substrate and the package technology are evolved accordingly to meet the trend. One example is the development of the flip-chip packaging technology, especially the flip-chip chip size package (FCCSP) and the flip-chip package-on-package (FCPOP), which are advanced IC fabrication methods capable of assembling and packaging various IC components of different characteristics and are being applied primarily in network communication devices, whichever require high performance in high-frequency high-speed operations and high-density distribution in IC packages that are thinner, lighter and smaller, such as smart phones, tablet computers, and notebook computers. In response to the aforesaid trend of thinner, lighter and smaller, it is in need of a new and advanced flip-chip packaging solution.

SUMMARY OF THE INVENTION

The present invention provides a package structure, which comprises: a protective insulation layer; a wiring layer, having at least one metal wire and disposed on the protective insulation layer; a first package unit, disposed on the wiring layer and being configured with a plurality of metal pillars, a first integrated-circuit chip and a first molding compound layer in a manner that the plural metal pillars are located in a pillar region and electrically connected to the at least one metal wire, the first integrated-circuit chip is located in a device region and electrically connected to the at least one metal wire, and the first molding compound layer is arranged filling up the remaining part of the first package unit excluding the first integrated-circuit chip and the plural metal pillars; and a second package unit, disposed on the first package unit and being configured with a second integrated-circuit chip and a second molding compound layer in a manner that the second integrated-circuit chip is connected electrically to the plural metal pillars, and the second molding compound layer is arranged filling up the remaining part of the second package unit excluding the second integrated-circuit chip.

In an exemplary embodiment of the present invention, the wiring layer further comprises a dielectric material layer, disposed filling up the remaining part of the wiring layer excluding the at least one metal wire.

In an exemplary embodiment of the present invention, the dielectric material layer and the first molding compound layer can be made of the same material or different materials, whereas the dielectric material layer can be made of a photosensitive resin composition or a non-photosensitive resin composition, such as bismaleimide-triazine (BT) resin, polymide (PI) resin, ajinomoto build-up film (ABF), flame retardant 5 (FR5) glass-epoxy, liquid crystal polymide (LCP), telfon, and so on.

In an exemplary embodiment of the present invention, each of the plural metal pillars is a copper column.

In an exemplary embodiment of the present invention, each of the first molding compound layer and the second molding compound layer can be composed of a material selected from the group consisting of a novolac-based resin, an epoxy-based resin, and a silicon-based resin.

In an exemplary embodiment of the present invention, the first integrated-circuit chip further comprises: a plurality of first conductive pins, arranged connecting to the at least one metal wire; and the second circuit chip further comprises: a plurality of second conductive pins, arranged connecting to the plural metal pillars.

In an exemplary embodiment of the present invention, the package structure further comprises: a plurality of connectors, including bumps, passive components and active components that are disposed under the protective insulation layer and electrically connected to the at least one metal wire while being provided for connecting to active components and passive components of the package structure.

Moreover, the present invention further provide a method for fabricating a package structure, which comprises the steps of: (A) providing a carrier; (B) forming a wiring layer on the carrier while enabling the wiring layer to be formed including at least one metal wire; (C) forming a plurality of metal pillars on the wiring layer while enabling the plural metal pillars to connect electrically to the at least one metal wire; (D) providing a first integrated-circuit chip to be disposed on the wiring layer while enabling the first integrated-circuit chip to connect electrically to the at least one metal wire without overlapping with the plural metal pillars; (E) forming a first molding compound layer on the carrier while enabling the first molding compound layer to cover all the wiring layer, the plural metal pillars and the first integrated-circuit chip; (F) removing a portion of the first molding compound layer for exposing the plural metal pillars; (G) providing a second integrated-circuit chip to be disposed on the first molding compound layer while enabling the second integrated-circuit chip to connect electrically to the plural metal pillars; (H) forming a second molding compound layer on the first molding compound layer while enabling the second molding compound layer to cover the second integrated-circuit chip; and (I) removing the carrier and forming a protective insulation layer under the wiring layer.

In an exemplary embodiment of the present invention, the forming of a wiring layer in the step (B) further comprises the steps of: forming and patterning a first photo resist layer on the carrier; forming a first metal layer on an opening region of the patterned first photoresist layer; and patterning the first metal layer by the removing of the first photoresist layer so as to form the at least one metal wire.

In an exemplary embodiment of the present invention, the forming of a wiring layer in the step (B) further comprises the steps of: forming a dielectric material layer on the carrier; removing a portion of the dielectric material layer into a pattern of the at least one metal wire accordingly; and forming a first metal layer on the region of the carrier where the dielectric material layer had been removed so as to form the at least one metal wire.

In an exemplary embodiment of the present invention, the forming of a wiring layer in the step (B) further comprises the steps of: forming a first metal layer on the carrier; removing a portion of the first metal layer into a pattern of the at least one metal wire; and disposing a dielectric material layer on the region of the carrier where the first metal layer had been removed so as to enable the dielectric material layer along with the remaining first metal layer to form the wiring layer.

In an exemplary embodiment of the present invention, the forming of a plurality of metal pillars in the step (C) further comprises the steps of: forming and patterning a second photo resist layer on the carrier; forming a second metal layer on the patterned second photoresist layer; and patterning the second metal layer by the removing of the second photoresist layer so as to form the plural metal pillars.

In an exemplary embodiment of the present invention, the first integrated-circuit chip further comprises: a plurality of first conductive pins, arranged connecting to the at least one metal wire while the first integrated-circuit chip is being disposed on the wiring layer.

In an exemplary embodiment of the present invention, the step (E) is performed using a means selected from the group consisting of: a top molding means, a compression molding means, a transfer molding means and an injection molding means.

In an exemplary embodiment of the present invention, the step (F) uses polishing, grinding, sand blasting, plasma etching or chemical etching to remove the first molding compound layer in a top-down manner until the top ends of the plural metal pillars are exposed out of the covering of the first molding compound layer.

In an exemplary embodiment of the present invention, the second integrated-circuit chip further comprises: a plurality of second conductive pins, connecting to the exposed portions of the plural metal pillars while the second integrated-circuit chip is being disposed on the first molding compound layer.

In an exemplary embodiment of the present invention, the step (H) is performed using a means selected from the group consisting of: a top molding means, a compression molding means, a transfer molding means and an injection molding means.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

In the following embodiments of the present disclosure, when an element is described to be disposed above/mounted on top of or below/under another element, it comprises either the element is directly or indirectly disposed above/below the other element, i.e. when indirectly, there can be some other element arranged between the two; and when directly, there is no other element disposed between the two. It is noted that the descriptions in the present disclosure relate to "above" or "below" are based upon the related diagrams provided, but are not limited thereby. Moreover, the terms "first", "second", and "third", and so on, are simply used for clearly identifying different elements of the same nature, but those elements are not restricted thereby and must be positioned or arranged accordingly. In addition, the size or thickness of each and every element provided in the following diagrams of the present disclosure is only schematic representation used for illustration and may not represent its actual size.

Figure 1:
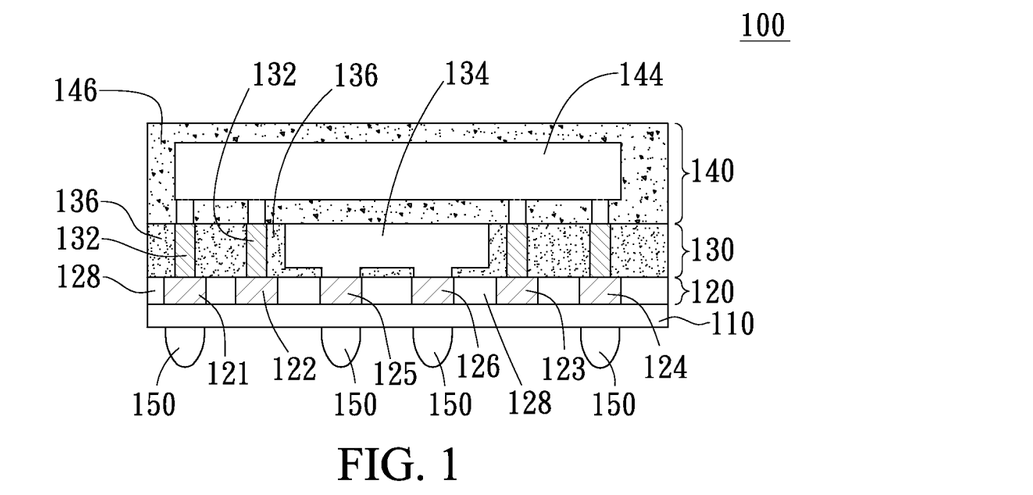
FIG. 1 is a sectional view of a package structure according to a first embodiment of the present invention.

Please refer to FIG. 1, which is a sectional view of a package structure according to a first embodiment of the present invention. In FIG. 1, a package structure 100 comprises: a protective insulation layer 110, a first wiring layer 120, a first package unit 130 and a second package unit 140. The protective insulation layer 110 which can be disposed at the outermost layer or the bottommost layer of the package structure 100 is used for protecting the package structure 100 from any adverse affect of its surrounding environment or posterior processes, such as soldering. As shown in FIG. 1, the first wiring layer 120 is disposed on the protective insulation layer 110 and is formed with at least one metal wire that is to be used for constructing the predefined circuitry layout of the package structure 100, as the metal wires 121~126 shown in FIG. 1. In this embodiment, the first package unit 130 is disposed on the first wiring layer 120 and is configured with a plurality of metal pillars 132, a first integrated-circuit chip 134 and a first molding compound layer 136 in a manner that the plural metal pillars 132 are electrically connected to the metal wires 121~124, the first integrated-circuit chip 134 electrically connected to the metal wires 125 and 126, and the first molding compound layer 136 is arranged filling up the remaining part of the first package unit 130 excluding the first integrated-circuit chip 134 and the plural metal pillars 132. Moreover, the integrated-circuit chip 134 is located in a device region of the first package unit 130, as the device region 137 shown in FIG. 4C; and the plural metal pillars 132 are located in a pillar region of the first package unit 130, as the pillar region 138 shown in FIG. 4C; whereas the device region 137 and the pillar region 138 are different areas in the first package unit 130 that are arranged without overlapping with each other. In addition, the second package unit 140 is disposed on the first package unit 130 and is configured with a second integrated-circuit chip 144 and a second molding compound layer 146 in a manner that the second integrated-circuit chip 144 is electrically connected to the plural metal pillars 132, and the second molding compound layer 146 is disposed filling up the remaining region of the second package unit 140 excluding the second integrated-circuit chip 144.

In this embodiment, each of the plural metal pillars 132 can be a conductive pillar that is made of copper, aluminum, nickel, tin, or other alloys, but is preferred to be a copper pillar; and each of the plural metal pillars 132 is used for electrically connecting the circuit component of the second package unit, such as the second integrated-circuit chip 144, to the first wiring layer 120 via the first package unit 130. In this embodiment, each of the first integrated-circuit chip 134 and the second integrated-circuit chip 144 is configured with a plurality of conductive pins, such as the first conductive pins of the first integrated-circuit chip 134 that are connected to the metal wires 125 and 126, and the second conductive pins of the second integrated-circuit chip 144 that are connected to the metal pillars 132, as shown in FIG. 1. Since the positioning of the metal pillars as well as their lengths and diameters can be controlled in the fabrication process, the high-precision and narrow-pitch alignment operation between the second conductive pins and the plural metal pillars 132 can be achieved both for those package structures with thinner first package unit 130 and for those package structures with smaller pitches in the second integrated-circuit chip 144. Each of the first and the second molding compound layers 136, 146 is formed by a means selected from the group consisting of: a top molding means, a compression molding means, a transfer molding means and an injection molding means; and moreover each of the first and the second molding compound layers 136, 146 is composed of a material selected from the group consisting of a novolac-based resin, an epoxy-based resin, and a silicon-based resin, whichever is capable of reducing the package thickness of the first package unit 130 and the second package unit 140 while preventing the resulting package structure 100 from deforming or wrapping, whereas the first molding compound layer 136 and the second molding compound layer 146 can be made of the same material. The first integrated-circuit chip 134 can be an active component that is disposed on or embedded into the first molding compound layer 136 so as to form the first package unit 130; and the second integrated-circuit chip 144 can be another active component that can also be disposed on or embedded into the second molding compound layer 146 so as to form the second package unit 140. In addition, since both the first and the second package units 130, 140 are flip-chip structures while the second package unit 140 is disposed and packaged on the first package unit 130, a package structure of the present invention is achieved for integrating and packaging IC units of different characteristics.

As shown in FIG. 1, for achieving electrical connection between the package structure 100 to with external circuits, there can be openings or via holes to be formed on the protective insulation layer 110 while enabling electric connectors, such as bumps 150, to be formed under the protective insulation layer 110 that are to be used for filling the openings or via holes during the formation of the bumps 150 and the same time connecting electrically to the metal wires 121, 124, 125 and 126. Except for the wires 121~126, the other portion of the first wiring layer 120 can be filled with a dielectric material layer 128 that is to be used for separating and insulating the metal wires 121~126 from one another. In another embodiment, that portion of the first wiring layer 120 excluding the metal wires 121~126 is filled directly by the first molding compound layer, as the package structure 200 shown in the second embodiment of FIG. 2. That is, the dielectric material layer 128 of FIG. 1 and the first molding compound layer 136 can be made of the same material or different materials, whereas the dielectric material layer 128 can be made of a photosensitive resin composition or a non-photosensitive resin composition, such as bismaleimide-triazine (BT) resin, polymide (PI) resin, ajinomoto build-up film (ABF), flame retardant 5 (FR5) glass-epoxy, liquid crystal polymide (LCP), telfon, and so on.

Figure 3:
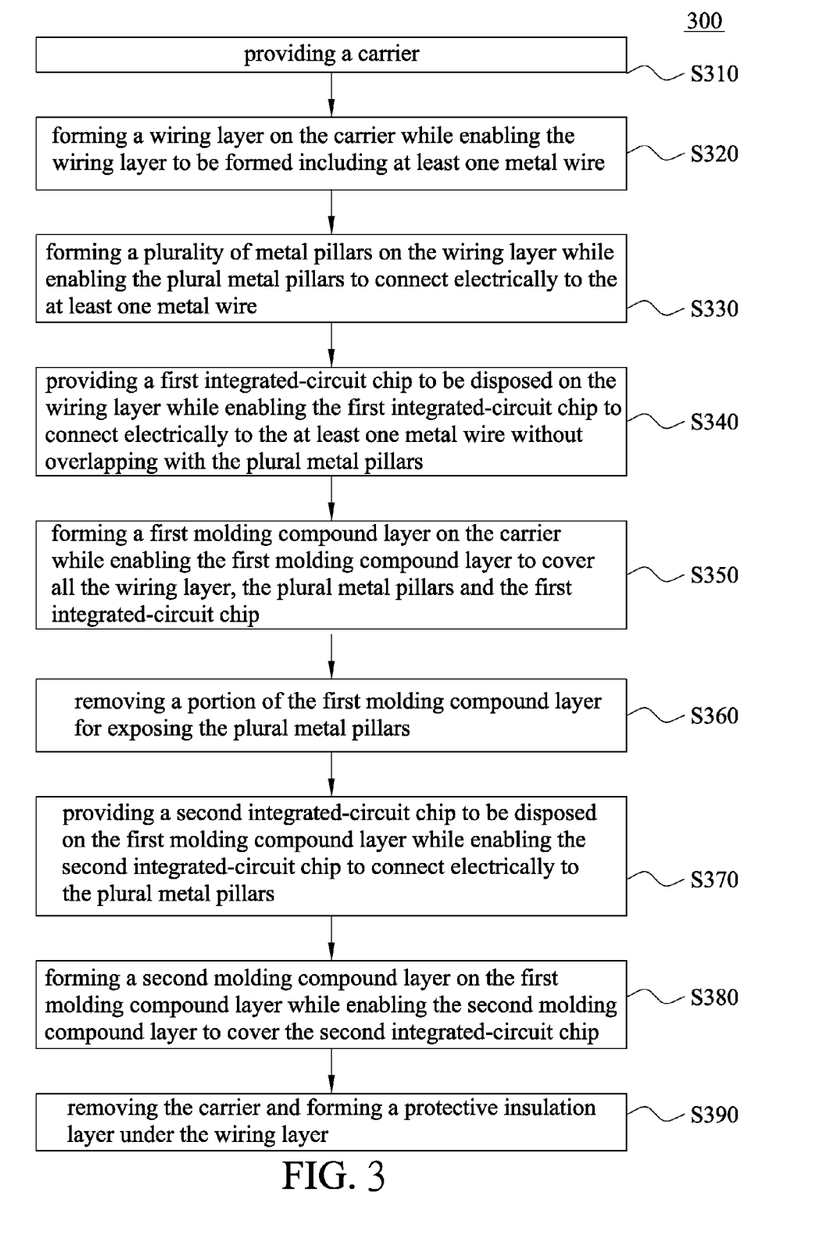
FIG. 3 is a flow chart depicting the steps performed in a method for fabricating a package structure according to an embodiment of the present invention.

FIG. 3 is a flow chart depicting the steps performed in a method 300 for fabricating a package structure 200 of the second embodiment of the present invention, and FIG. 4A to FIG. 4H are sectional views of a package structure in different steps S310~S390 of the fabrication method 300 of the present invention.

Figure 2:
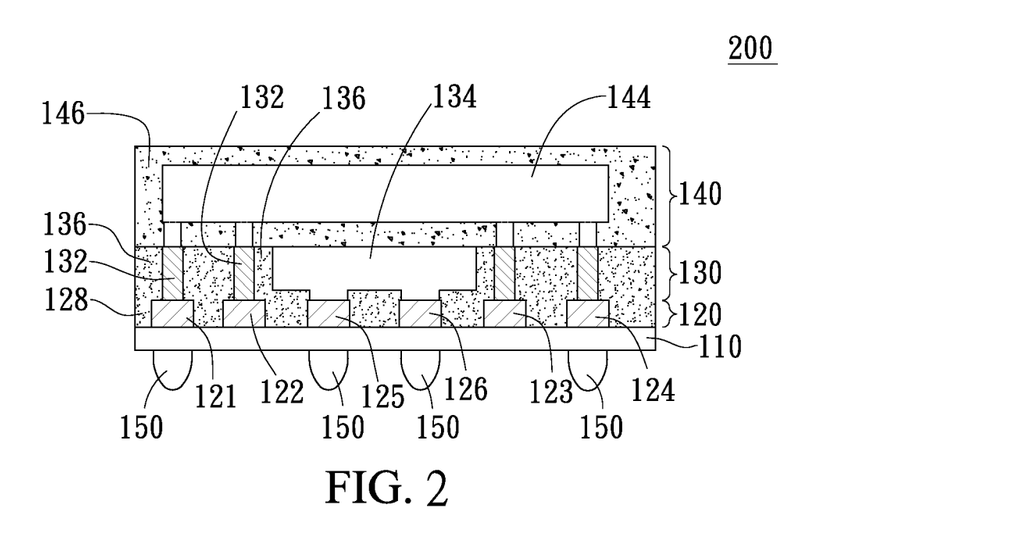
FIG. 2 is a sectional view of a package structure according to a second embodiment of the present invention.
Figure 4A:
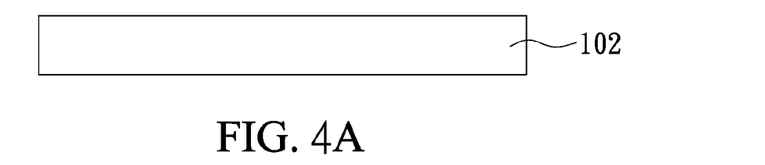
FIG. 4A to FIG. 4H are sectional views of a package structure in different steps of the present invention.
Figure 4B:
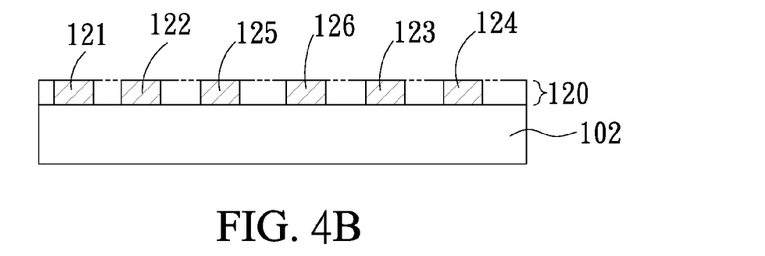
Figure 4C:
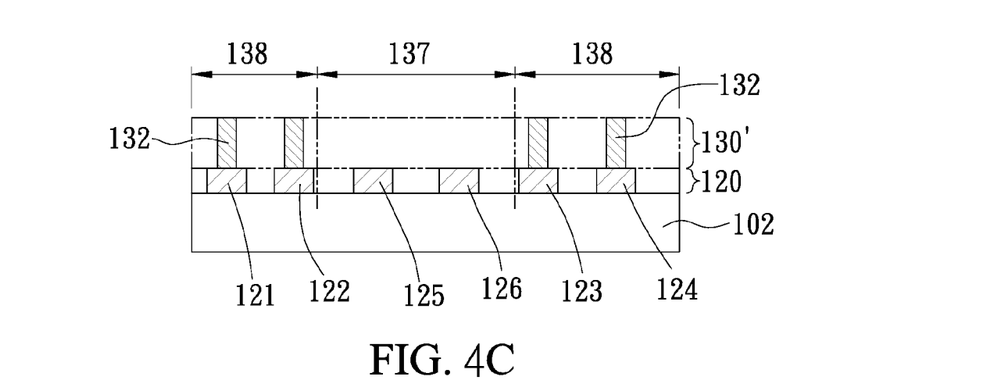
Figure 4D:
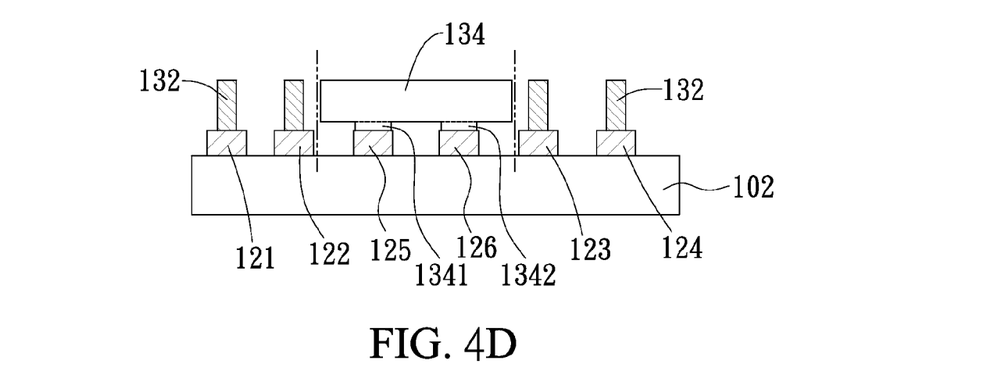
Figure 4E:
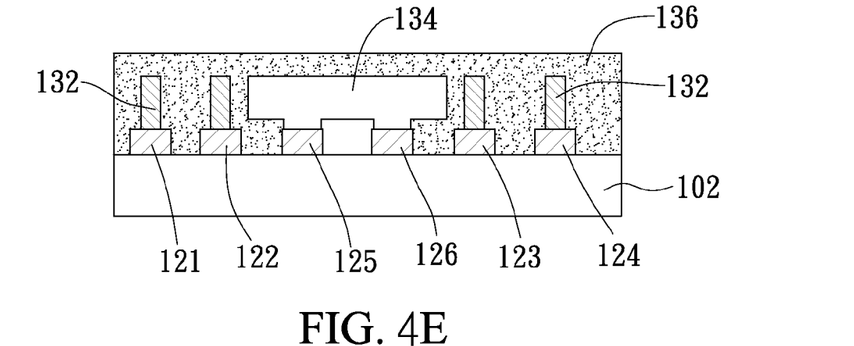
Figure 4F:
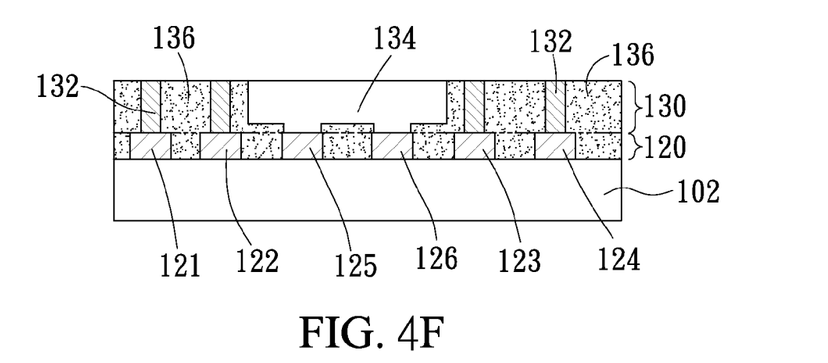
Figure 4G:
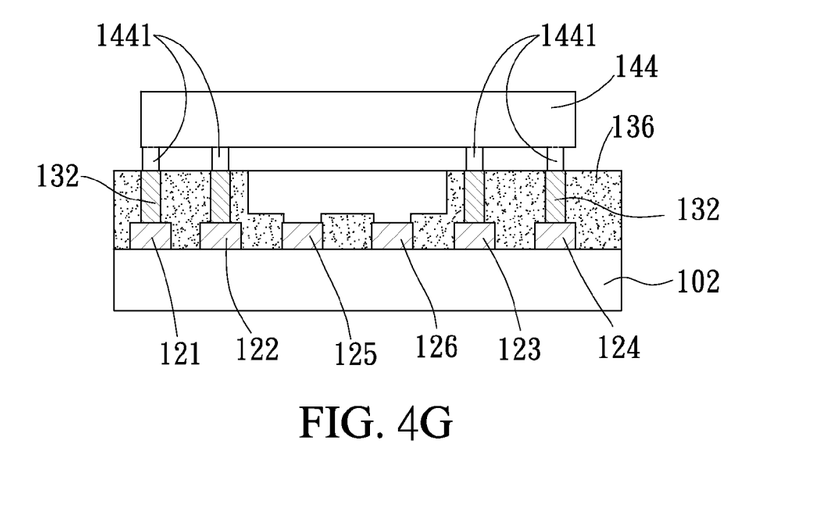
Figure 4H:
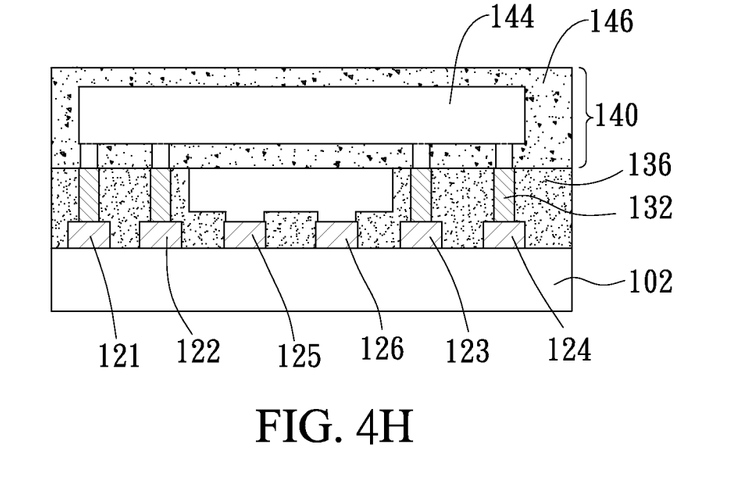

The fabrication method 300 comprises the following steps:

S310: providing a carrier 102, as shown in FIG. 4A; whereas the carrier 102 can be a metal substrate or a fiberglass core substrate having metal layers, and can be used for supporting electric circuits and electric components disposed thereon, such as the first wiring layer 120, the first package unit 130 and the second package unit 140 that are shown in FIG. 1 and FIG. 2; and the aforesaid metal can be Fe, Fe/Ni, Cu, Al, or the composition or alloy thereof, but is not limited thereby;

S320: forming a first wiring layer 120 on the carrier 102 while patterning the first wiring layer 120 into a predefined pattern including at least one metal wire, such as the metal wires 121~126, as shown in FIG. 4B; whereas the first wiring layer 120 can be formed using an electrolytic plating process or an evaporation process, and the patterning of the first wiring layer 120 can be enabled using a photolithography process; moreover, in one embodiment, the formation of the first wiring layer 120 further comprises the steps of: depositing a first photoresist layer on the carrier 102 using a PCB build-up process or a spin coating process; patterning the first photoresist layer using an exposure-developing process so as to form a plurality of openings; forming a first metal layer on the openings of the patterned first photoresist layer; and forming the first wiring layer 120 while patterning the same into a predefined pattern including the metal wires 121~126 by removing the first photoresist layer using a dry mechanical means or a wet chemical means; and moreover, in another embodiment, the step S320 can be performed by laser processing, such as the step S320': forming a first metal layer on the carrier; and using a laser carving process to remove a specific portion of the first metal layer into a pattern including the metal wires 121~126;

S330: forming a plurality of metal pillars 132, such as copper pillars or aluminum pillars, on the first wiring layer 120, as shown in FIG. 4C, that are to be used for electrically connecting the first wiring layer 120 to circuit components, such as the second integrated-circuit chip 144 of the second package units 140, that are formed in the posterior steps; whereas the metal pillars 132 can be formed from a metal, such as copper or aluminum, by an electrolytic plating process or an evaporation process, and the patterning of the metal pillars can be enabled using a photolithography process; moreover, in one embodiment, the formation of the plural metal pillars 132 further comprises the steps of: depositing a second photoresist layer on the carrier 102 and the first wiring layer 120 using a dry film photoresist lamination process; patterning the second photoresist layer using an exposure-developing process so as to form a plurality of openings; forming a second metal layer on the openings of the patterned second photoresist layer; and patterning the second metal layer into the plural metal pillars 132 by removing the second photoresist layer using a dry mechanical means or a wet chemical means; and moreover, during the proceeding of the step S330, the layer where the metal pillars 132 are formed is referred as a first package layer 130', and the first package layer 130' can be divided into two regions, i.e. the device region 137 and the pillar region 138 shown in FIG. 4C, in which the patterning of the second photoresist layer is going to enable the metal pillars to be formed inside the pillar region 138 while connecting electrically to the metal wires 121~124, and the second photoresist layer corresponding to the device region 137 to be removed completely into a recess that can be provided for receiving circuit components, such as the first integrated-circuit chip 134;

S340: providing a first integrated-circuit chip 134 to be disposed on the first wiring layer 120 while enabling the first integrated-circuit chip 134 to connect electrically to the metal wires 125 and 126, as shown in FIG. 4D, while enabling the first integrated-circuit chip 134 to be active device that is disposed inside the device region 137 of first package layer 130' and the plural metal pillars 132 to be disposed inside the pillar region 138 of the first package layer 130', by that although both the first integrated-circuit chip 134 and the plural metal pillars 132 are disposed on the first package layer 130' but are resided inside respectively in the device region 137 and the pillar region 138 without overlapping; and moreover, in one embodiment, the first integrated-circuit chip 134 further comprises: a plurality of first conductive pins, such as the two pins 1341 and 1342 that are arranged aligned and connecting respectively metal wires 125 and 126 while the first integrated-circuit chip 134 is mounted to the first wiring layer 120;

S350: forming a first molding compound layer 136 on the carrier 102 while enabling the first molding compound layer 136 to cover all the metal wires 121~126, the plural metal pillars 132 and the first integrated-circuit chip 134 so as to construct one of the package unit in the package structure 200 of the present invention, as shown in FIG. 4E; whereas the first molding compound layer 136 is formed by a means selected from the group consisting of: a top molding means, a compression molding means, a transfer molding means and an injection molding means, and can comprises the steps of: placing a material of the first molding compound layer into a first casting mold; arranging the first casting mold to be aligned corresponding to the carrier 102 for enabling the metal wires 121~126, the metal pillars 132 and the first integrated-circuit chip 134 to be disposed at a position between the first casting mold and the carrier 102; forcing the first casting mold and the carrier 102 to be pressed together while curing the material of the first molding compound layer to be hardened into the first molding compound layer that are arranged covering all the metal wires 121~126, the plural metal pillars 132 and the first integrated-circuit chip 134; and removing the first casting mold so that a structure with a cross section as the one shown in FIG. 4E is constructed; and moreover, in an other embodiment, the formation of the first molding compound layer 136 can otherwise comprises the steps of: providing a first casting mold and a material of the first molding compound layer that can be a power-like material or a platelet-like material; heating the material of the first molding compound layer into its liquid state while enabling the liquefied first molding compound layer to flow into the first casting mold; arranging the first casting mold to be aligned corresponding to the carrier 102 for enabling the metal wires 121~126, the metal pillars 132 and the first integrated-circuit chip 134 to be disposed at a position between the first casting mold and the carrier 102; forcing the first casting mold and the carrier 102 to be pressed together while curing the material of the first molding compound layer to be hardened into the first molding compound layer 136 that are arranged covering all the metal wires 121~126, the plural metal pillars 132 and the first integrated-circuit chip 134; and removing the first casting mold so that a structure with a cross section as the one shown in FIG. 4E is constructed; in addition, the first molding compound layer 136 is composed of an insulation material selected from the group consisting of a novolac-based resin, an epoxy-based resin, and a silicon-based resin, but is not limited thereby;

S360: removing a portion of the first molding compound layer 136 for exposing the plural metal pillars 132 so as to form the first package unit 130, as shown in FIG. 4F, i.e. enabling a first package unit 130 to be formed including the plural metal pillars 132, the first integrated-circuit chip 134 and the first molding compound layer 136 and to be disposed on the first wiring layer 120; whereas the first molding compound layer 136 is filled inside the first package unit 130 excluding the portion thereof that is occupied by the metal pillars 132 and the first integrated-circuit chip 134; and moreover, although all the metal wires 121~126 on the carrier 102 are covered by the first molding compound layer 136 at this point, the top half of the first molding compound layer must be removed for exposing the top half of the plural metal pillars 132 so as to allowing another active component, such as a second integrated-circuit chip 144, to be connected to the metal wires 121~124 via the metal pillars 132 in the posterior process, and the removal of the top half of the first molding compound layer 136 can be performed using a means of polishing, grinding, sand blasting, plasma etching or chemical etching to remove the top half of the first molding compound layer 136 in a top-down manner until the top ends of the plural metal pillars 132 are exposed out of the covering of the first molding compound layer, but is not limited thereby; and in another embodiment, the first molding compound layer 136 is formed just for allowing the top ends of the plural metal pillars 132 to be exposed, and thus the process for removing the top half of the first molding compound layer 136 can be avoided;

S370: providing a second integrated-circuit chip 144 to be disposed on the first package unit 130 while enabling the second integrated-circuit chip 144 to connect electrically to the plural metal pillars 132, as shown in FIG. 4G; whereas the second integrated-circuit chip 144 is another active component that is configured with a plurality of second conductive pins 1441, and the plural conductive pins 1441 are arranged aligning and electrically connected to the exposed top ends of the metal pillars 132 in respective when the second integrated-circuit chip 144 is mounted on the first package unit 130;

S380: forming a second molding compound layer 146 on the first package unit 130 while enabling the second molding compound layer 146 to cover the second integrated-circuit chip 144 so as to construct another package unit 140 in the package structure 200 of the present invention, as shown in FIG. 4H; whereas the second molding compound layer 146 is formed by a means selected from the group consisting of: a top molding means, a compression molding means, a transfer molding means and an injection molding means, and can comprises the steps of: placing a material of the second molding compound layer 146 into a second casting mold; arranging the second casting mold to be aligned corresponding to the carrier 102 for enabling the second integrated-circuit chip 144 to be disposed at a position between the second casting mold and the carrier 102; forcing the second casting mold and the carrier 102 to be pressed together while curing the material of the second molding compound layer 146 to be hardened into the second molding compound layer 146 that are arranged covering all the second integrated-circuit chip 144 that is disposed on the first package unit 130; and removing the second casting mold so that a structure with a cross section as the one shown in FIG. 4H is constructed; and moreover, in an other embodiment, the formation of the second molding compound layer 146 can otherwise comprises the steps of: providing a second casting mold and a material of the second molding compound layer that can be a power-like material or a platelet-like material; heating the material of the second molding compound layer 146 into its liquid state while enabling the liquefied second molding compound layer 146 to flow into the second casting mold; arranging the second casting mold to be aligned corresponding to the carrier 102 for enabling the second integrated-circuit chip 144 to be disposed at a position between the second casting mold and the carrier 102; forcing the second casting mold and the carrier 102 to be pressed together while curing the material of the second molding compound layer 146 to be hardened into the second molding compound layer 146 that are arranged covering the second integrated-circuit chip 144; and removing the first casting mold so that a structure with a cross section as the one shown in FIG. 4H is constructed; in addition, the first molding compound layer 136 is composed of an insulation material selected from the group consisting of a novolac-based resin, an epoxy-based resin, and a silicon-based resin, but is not limited thereby;

S390: removing the carrier 102 and forming a protective insulation layer 110 under the first wiring layer 120; whereas, at this stage, the use of the carrier 102 is no longer needed so it is removed, and the removal of the carrier 102 can be performed using a chemical etching means or a laser means; and the protective insulation layer 110 which can be disposed at the outermost layer of the package structure 200, i.e. it is positioned under the first wiring layer 120, is used for protecting the package structure 200 from any adverse affect of its surrounding environment or posterior processes, such as soldering.

At this point, the major part of the package structure 200 had been completed. Thereafter, in order to provide a means for connecting the package structure 200 electrically to external circuits, there are electric connectors, such as bumps 150, to be formed on the openings of the protective insulation layer 110 that are to be used for connecting the metal wires 121, 124, 125 and 126 electrically to external circuits. As shown in FIG. 2, there are a plurality of electric connectors to be disposed under the protective insulation layer 110 while being connected electrically to the at least one metal wire that are used for connecting the active components and the passive components in the package structure 200, or the active components and the passive components can be soldered directly to the plural electric connectors.

In addition, the first wiring layer 120 further comprises a dielectric material layer 128, that is disposed filling up the remaining part of the first wiring layer 120 excluding the metal wires 121~126, and is used for separating and insulating the metal wires 121~126 from one another while reducing the generation of voids or bubbles when there are insufficient filling of the first molding compound layer 136. The dielectric material layer 128 can be made of a photosensitive resin composition or a non-photosensitive resin composition, such as bismaleimide-triazine (BT) resin, polymide (PI) resin, ajinomoto build-up film (ABF), flame retardant 5 (FR5) glass-epoxy, liquid crystal polymide (LCP), telfon, and so on. In another embodiment, the aforesaid fabrication method 300 can further comprise a step S321: enabling a dielectric material layer to be formed at a position where the first metal had been removed, that is performed after the step S320 or S320'. Moreover, the operation of the steps S320' and S321 can be performed for allowing the dielectric material layer 120 to formed into a predefined pattern and then enabling the first metal layer 128 to be deposited onto positions where there is no dielectric material layer, that is, according to the following steps: enabling a dielectric material layerdielectric material layer to be formed on the carrier 102; patterning the dielectric material layerdielectric material layer by the removing of a specific portion of the dielectric material layer dielectric material layer using an exposure-developing process or a laser process so as to form a pattern of the metal wires 121~126 on the dielectric material layer; depositing a first metal layer on the position where the dielectric material layer had been removed so as to form a first wiring layer by the composition of the remaining dielectric material layer 128 and the metal wires 121~126. Consequently, a package structure 100 of FIG. 1 is achieved, whereas the performing of the steps S310, S330, S340, S350, S360, S370, S380 and S390 are the same as those described in the fabrication method 300, and thus will not described further herein.

Figure 5:
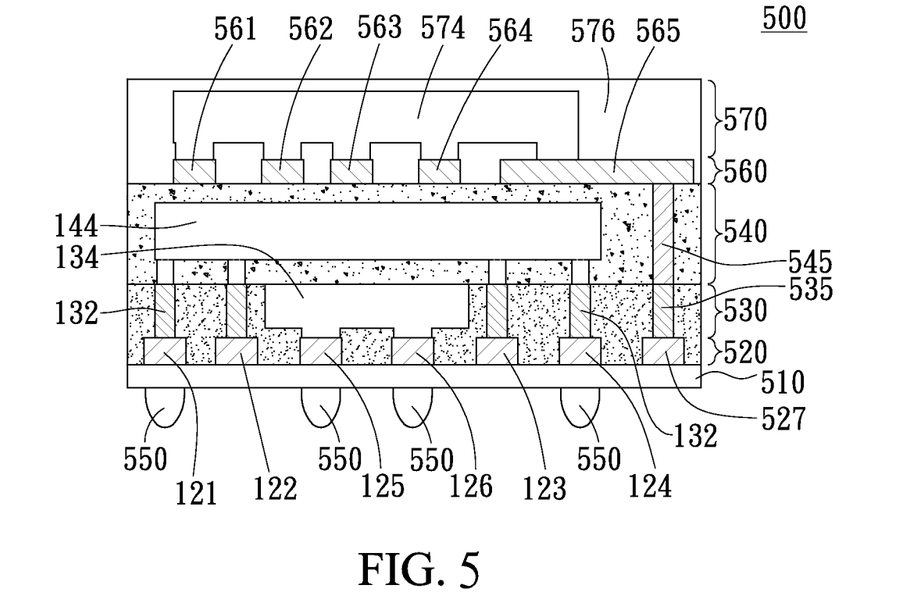
FIG. 5 is a sectional view of a package structure according to a third embodiment of the present invention.

It is noted that although the package structure in the foregoing embodiments is configured with two package units, i.e. the first package unit 130 and the second package unit 140, it is not limited thereby and thus there can be more than two package units being included in the FCPOP of the present invention. Please refer to FIG. 5, which is a sectional view of a package structure according to a third embodiment of the present invention. In FIG. 5, the exemplary package structure is configured with three package units and has multiple dielectric material layers and multiple wiring layers. As shown in FIG. 5, a package structure 500 comprises: a plurality of bumps 550, an protective insulation layer 510, a first wiring layer 520, a first package unit 530, a second package unit 540, a second wiring layer 560, and a third package unit 570. In this third embodiment of FIG. 5, the plural bumps 550, the protective insulation layer 510, the first wiring layer 520, the first package unit 530 and the second package unit 540 are the equivalence of the bumps 150, the protective insulation layer 110, the first wiring layer 120, the first package unit 130 and the second package unit 140 of the first embodiment, and the difference is that: the first wiring layer 520 further comprises metal pillars 535, the second package unit further comprises metal pillars 545, whereas the metal pillars 535 are connected to the metal pillars 545 and the metal wires 527 that are provided for allowing the third package unit 570 to connect to external circuits. In addition, the second wiring layer 560 comprises a plurality of metal wires 561~565, and the third package unit 570 comprises a third integrated-circuit chip 574, whereas the other portions of the third package unit 570 are formed similar to the second package unit 140 of the first embodiment. Furthermore, the third integrated-circuit chip 574 is arranged electrically connecting to the metal wires 561~565, while enabling the metal wire 565 to connect to external circuits of the package structure 500 via the connection of the metal pillars 545, the metal pillars 535 and the metal wire 527. The construction of the package structure in this third embodiment that is similar to the package structure of the first embodiment is not described further herein.

It is noted that the aforesaid embodiments of the present invention is exemplified using package structures, but they are not limited thereby. In the embodiments of the present invention, by the use of the metal pillars that are arranged piecing through the bottom-layered package unit, i.e. the first package unit 130, the electric components in the top layered package unit, i.e. the second package unit 140, can be connected to the metal wires or the external circuits. Since the positioning of the metal pillars as well as their lengths and diameters can be controlled in the fabrication process, the high-precision and narrow-pitch alignment operation between the second conductive pins and the plural metal pillars can be achieved both for those package structures with thinner first package unit and for those package structures with smaller pitches in the second integrated-circuit chip. Moreover, as the present invention adopts a molding compound with high rigidity for packaging each and every of its package units, such as the package units 130, 140 and 570, the thickness of the package unit is reduced and the wrapping and deformation of the package structure can be prevented effectively.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A package structure, comprising:
   a protective insulation layer;
   a wiring layer, having at least one metal wire and disposed on the protective insulation layer; and
   a first package unit, disposed on the wiring layer, comprising:
      a plurality of metal pillars, wherein the plurality of metal pillars are located in a pillar region and electrically connected to the at least one metal wire;
      a first integrated-circuit chip, located in a device region and electrically connected to the at least one metal wire;
      a first molding compound layer; and
      a remaining part, wherein the remaining part is a space of said first package unit not occupied by said first integrated-circuit chip and said plurality of metal pillars, and the first molding compound layer is arranged filling up the remaining part;
   wherein, each of the plurality of metal pillars is a copper column; and a top surface of the metal pillars, a top surface of the first integrated-circuit chip, and a top surface of the first molding compound layer form a flat surface; said top surface of the first integrated-circuit chip is not covered by said top surface of the first molding compound layer; and said flat surface is a top surface of the first package unit.

2. The package structure of claim 1, further comprising:
   a second package unit, disposed on the top surface of the first package unit and being configured with a second integrated-circuit chip and a second molding compound layer in a manner that the second integrated-circuit chip is connected electrically to the plural metal pillars, and the second molding compound layer is arranged filling up the remaining part of the second package unit excluding the second integrated-circuit chip;
   wherein, the second package unit and the first package unit are directly adjacent.

3. The package structure of claim 1, wherein the wiring layer further comprises:
   a dielectric material layer, disposed filling up the remaining part of the wiring layer excluding the at least one metal wire.

4. The package structure of claim 3, wherein the dielectric material and the first molding compound layer are made of the same material or different materials.

5. The package structure of claim 1, wherein the first molding compound layer is composed of a material selected from the group consisting of a novolac-based resin, an epoxy-based resin, and a silicon-based resin.

6. The package structure of claim 2, wherein the second molding compound layer is composed of a material selected from the group consisting of a novolac-based resin, an epoxy-based resin, and a silicon-based resin.

7. The package structure of claim 1, wherein the first integrated-circuit chip further comprises:
   a plurality of first conductive pins, arranged connecting to the at least one metal wire.

8. The package structure of claim 2, wherein the second circuit chip further comprises:
   a plurality of second conductive pins, arranged connecting to the plural metal pillars.

9. The package structure of claim 1, further comprising:
   a plurality of connectors, disposed under the protective insulation layer and electrically connected to the at least one metal wire.

10. The package structure of claim 1, wherein the first package unit consists of the first integrated-circuit chip, the plurality of metal pillars, and the remaining part filled with said first molding compound layer.

* * * * *